United States Patent [19]

Smith

[11] Patent Number: 4,978,907
[45] Date of Patent: Dec. 18, 1990

[54] APPARATUS AND METHOD FOR EXPANDING THE FREQUENCY RANGE OVER WHICH ELECTRICAL SIGNAL AMPLITUDES CAN BE ACCURATELY MEASURED

[75] Inventor: Douglas C. Smith, Rumson, N.J.

[73] Assignee: AT&T Bell Laboratories, Murray Hill, N.J.

[21] Appl. No.: 349,724

[22] Filed: May 10, 1989

[51] Int. Cl.$^5$ .................... G01R 1/02; G01R 31/00
[52] U.S. Cl. ..................... 324/72.5; 324/149
[58] Field of Search ............ 324/72.5, 149, 158 P

[56] References Cited

U.S. PATENT DOCUMENTS

| | | | |
|---|---|---|---|
| 2,883,619 | 4/1959 | Kobbe et al. | 324/72.5 |
| 3,532,982 | 10/1970 | Zeidlhack et al. | 324/72.5 |
| 3,612,999 | 10/1971 | Bergero | 324/149 |
| 4,418,314 | 11/1983 | Nieto, Jr. | 324/149 X |

Primary Examiner—Reinhard J. Eisenzopf
Assistant Examiner—Jack B. Harvey
Attorney, Agent, or Firm—David R. Padnes

[57] ABSTRACT

It has been found that the ground lead of a measurement instrument probe has an inductance which, when coupled with the capacitance of the rest of the probe, forms a resonant circuit. The net result is a peak in the frequency response of the probe which interferes with accurate amplitude measurements of test signals having a frequency above some threshold. Pursuant to the present invention, a resistor is added to the measurement instrument probe whose value substantially flattens the frequency response of the probe and permits accurate amplitude measurements over a substantially greater frequency range. This resistor, either having a fixed or adjustable value, can be added to the measurement instrument probe or can be included in an adjunct which fits over a probe end.

10 Claims, 3 Drawing Sheets

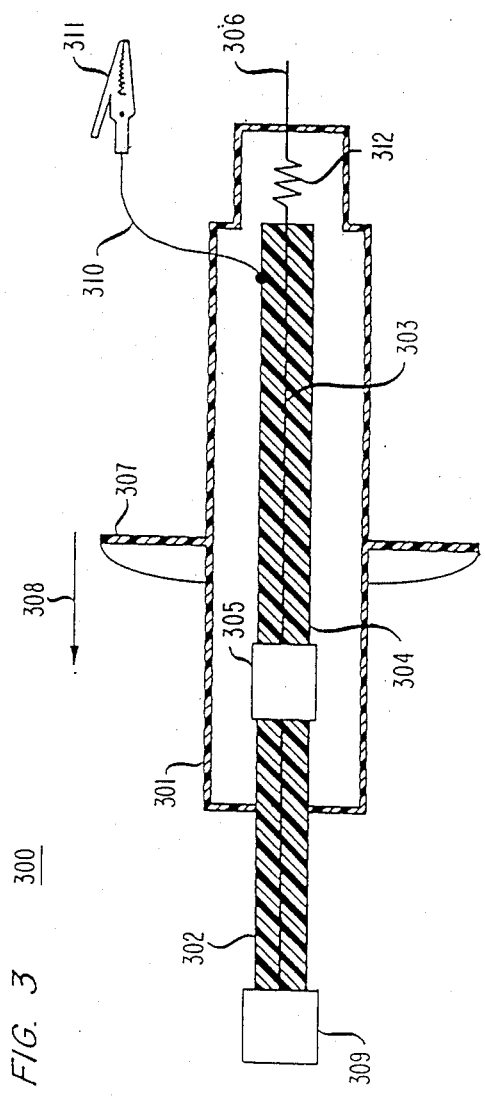
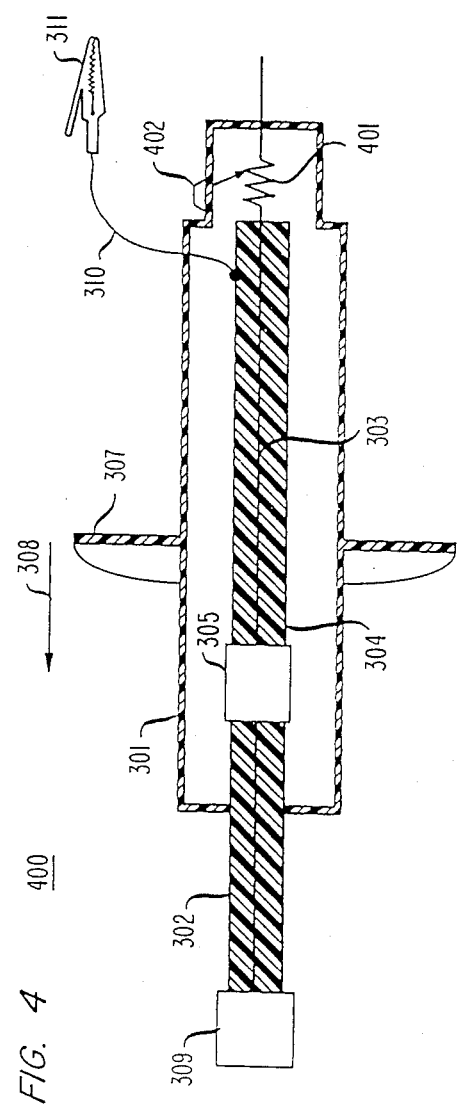
FIG. 3
FIG. 4

APPARATUS AND METHOD FOR EXPANDING THE FREQUENCY RANGE OVER WHICH ELECTRICAL SIGNAL AMPLITUDES CAN BE ACCURATELY MEASURED

TECHNICAL FIELD

The present invention relates to the field of electrical measurement apparatus and, more particularly, to a probe for use with such apparatus which permits the amplitude of signals to be accurately measured over a wide range of frequencies.

BACKGROUND OF THE INVENTION

Electronic measurement equipment is typically operated with one or more probes. The function of each probe is to conduct a signal from a circuit under test to the measurement equipment where the signal is displayed or processed. Each probe typically includes a conductor for transporting the measured signal and another conductor which is tied to ground. In addition, a probe can include circuitry which amplifies or attenuates the amplitude of the measured signal in a uniform manner. One characteristic of a probe is its ability to accurately deliver a signal lying within some range of frequencies in the circuit under test or an amplified or attenuated replica thereof to the measurement equipment. One part of this characteristic, referred to as the frequency response of the probe, is defined as the variation of the ratio of the measured signal amplitude to that delivered to the measurement equipment with frequency. For accurate measurements, the frequency response should be unity or some constant value for some range of frequencies which encompasses the frequency of any measured signal.

Equipment which provides different types of electronic measurements is designed with the ability to provide accurate measurement of a signal amplitude in a circuit under test extending over a predefined frequency range. In general, the greater this frequency range, the more expensive the measurement equipment. While amplitude measurements of test signals having frequencies lying outside of this predefined frequency range may or may not be possible, depending on the measurement equipment, any results may be grossly inaccurate. For example, significant overshoot and ringing can be displayed on an oscilloscope which can easily be interpreted as noise in the circuit under test.

It would be extremely desirable if the frequency range or bandwidth over which accuracy amplitude measurements can be made with a given piece of measurement apparatus could be expanded. Such expansion would increase the capabilities of any piece of measurement equipment and could avoid the need for additional measurement and test equipment purchases.

SUMMARY OF THE INVENTION

In accordance with the present invention, the frequency range or bandwidth over which amplitude of a signal can be accurately measured is increased. This improvement results from the recognition that the probe used with most measurement equipment forms a resonant circuit which produces a non-flat frequency response for the measurement probe. Accordingly, by incorporating a resistor in the scope probe whose value dampens the frequency response or, equivalently, lowers the Q of the resonant circuit, signal amplitudes can be measured whose frequencies extend over a wider range. In one arrangement, this resistance is incorporated into a standard probe while, in another arrangement, this resistance is disposed in a probe adjunct which is designed to fit over an end of the measurement probe. In either arrangement, the resistance value may be fixed or can be variable. In the former case, the resistance value is one which nominally damps the resonant response of the scope probe while, in the latter case, the resistance can be adjusted to provide a value which precisely damps the resonant frequency of the scope probe.

BRIEF DESCRIPTION OF THE DRAWING

FIGS. 3 and 4 are representations of two embodiments of a scope probe which incorporate the present invention.

DETAILED DESCRIPTION

It has been found that when a ground lead is used with a measurement instrument probe, the inductance of the lead in combination with the capacitance of the probe forms a resonant circuit. The net result of the resonant response is a peak in the frequency response of the probe.

Figure 1:
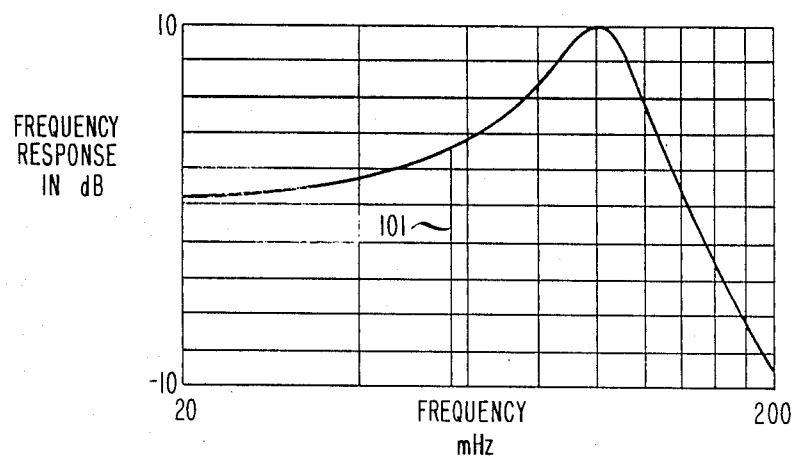
FIGS. 1 and 2 respectively are logarithmic graphical plots of the frequency response of a prior art measurement probe and one which incorporates the present invention.
Figure 2:
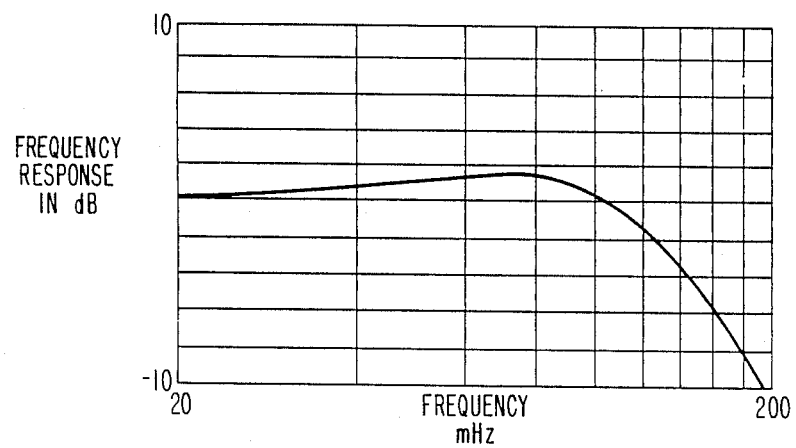

FIGS. 1 and 2 respectively show the frequency response of a prior art oscilloscope probe and one which incorporates the present invention. Each of these probes incorporates (a) a 10×, i.e., a 10 times circuit, which attenuates the amplitude of the measured signal by a factor of ten and (b) a 6-inch ground lead. This enables the oscilloscope to display signals which would either overload the oscilloscope circuitry or be loaded down or altered by the probe if it were not for the attenuator in the probe. The ground lead extends from the probe and typically has a clip on the end to enable connection to a point of measurement.

The frequency response, plotted in dBs in FIGS. 1 and 2 over a frequency range extending from 20 to 200 MHz, is defined as the ratio of the signal amplitude delivered to the oscilloscope, $V_O$, divided by a reference signal amplitude $V_{gen}$. The frequency response shown in FIG. 1 begins to rise sharply at frequencies above 45 MHz, reaches a peak and then falls rapidly. This non-flat response to the right of line 101 in FIG. 1 leads to significant overshoot and ringing on the oscilloscope that might be erroneously interpreted as noise in the circuit under test. As a result, accurate amplitude measurements above 45 MHz are effectively prohibited. In contrast, it will be noted that in FIG. 2 the frequency response is substantially flattened. This improvement, achieved by incorporating a resistor in the probe in series with the probe signal conducting lead, is significant. In FIG. 1, for example, the response error is greater than 2 dB above 50 MHz while in FIG. 2 this error does not exceed 2 dB until over 120 MHz.

To obtain the illustrated improvement, the parameter that is important is the total series resistance in the circuit including the impedance of the reference source or circuit under test and the added series resistance in the probes's signal conducting lead. For a typical probe and ground lead, a total of 150 to 200 ohms has been found to be optimum for many applications. Since most digital circuits have an impedance of 50 to 100 ohms, the range of suitable resistance values is from 50 to 150 ohms, with 100 ohms being a nominal value.

Refer now to FIGS. 3 and 4 which show two embodiments of an oscilloscope probe which incorporate the present invention. Probe 300 includes a body member 301 which houses a portion coaxial cable 302 and the signal carrying conductor 303 and ground shield 304 therein. The body member 301 also houses a 10× circuit 305 which attenuates any signal conducted by the probe by a factor of 10. This attenuation advantageously provides a ten-fold increase in the maximum signal level that can be monitored by any measurement equipment. The attenuation also reduces the loading on the circuit under test by increasing the probe's input impedance.

The signal-carrying conductor is connected to a tip 306 which can be further extended from body member 301 by movement of flange 307 in the direction 308. Such movement actuates a well-known mechanism (not shown). The rear of coaxial cable 302 terminates in a connector 309 which mates with its counterpart in the oscilloscope or other measurement apparatus. Probe 300 also includes a ground lead 310 which terminates in a clip 311, suitable for connection to a lead or conductor pad, on one end and to the ground shield 304 on the other end. It is primarily the inductance of this lead 310 in combination with the rest of the probe 300 which forms the resonant circuit which limits the frequency range over which accurate amplitude measurements may be made. Additional inductance, of course, is inherent in the wiring or conductors in the circuit under test but such inductance is generally significantly smaller than the inductance of lead 310.

Pursuant to the present invention, probe 300 also incorporates a fixed resistor 312 which is serially connected between the signal conducting lead 303 and tip 306 and serves to damp the resonant response of the aforementioned resonant circuit.

FIG. 4 shows another probe 400 which is indentical to probe 300 except that the fixed resistor 312 is replaced by a potentiometer 401 which is adjusted by means of a slider 402 disposed on the exterior surface of body member 301. Use of a potentiometer in lieu of the fixed resistor allows selection of the exact resistor value which precisely damps the resonant response for each circuit under test.

Figure 5:
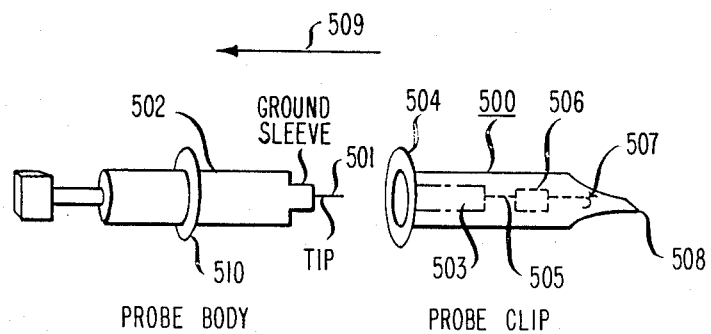
FIGS. 5 and 6 are representations of two embodiments of a scope probe adjunct which incorporate the present invention.
Figure 6:
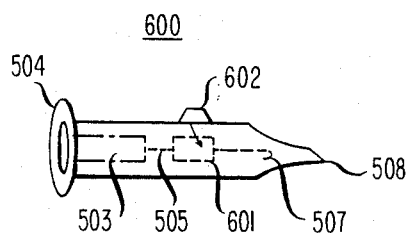

Refer now to FIGS. 5 and 6. The present invention can also be incorporated into a probe adjunct designed to fit over an end of a conventional test probe. Probe adjunct 500 is designed to fit over end 501 of a conventional oscilloscope probe 502. Probe adjunct has a cavity 503 which mates with end 501 until flanges 503 and 510 abut. A signal conductor 505 extends from the bottom of cavity 503 and is serially connected to one end of fixed resistor 506. The other end of resistor 506 is connected to a retractable hook 507, for gripping test leads or conductor pads, which is extendible beyond end 508 by movements of flanges 503 and 510 in the direction 509 using a conventional mechanism (not shown). Probe adjunct 600 operates in an identical manner to probe adjunct 500 and is identical in structure except that fixed resistor 506 is replaced by a potentiometer 601. This potentiometer is adjusted by movement of a slider 602 on the external surface of adjunct 600.

In the preferred embodiments, the value of the fixed resistor added to the probe or probe adjunct is 100 ohms and the potentiometer is a linear one having a range of 50 to 150 ohms.

It should, of course, be understood that while the present invention has been described in terms of several embodiments, other arrangements will be apparent to those skilled in the art. For example, while the present invention has been disclosed in reference to an oscilloscope probe or adjunct for the same, the present invention is applicable to measurement probes having a signal conducting lead and a ground lead which are used with other types of electrical measurement equipment.

I claim:

1. A probe for use with measurement equipment, said probe having an input impedance and comprising a probe tip for receiving signals from a circuit under test, a signal conducting lead having a capacitance and having a first end connected to said probe tip, and a ground lead for connection to said circuit under test, said ground lead having an inductance, the respective capacitance and inductance of said signal conducting lead and said ground lead forming a resonant circuit having a non-flat frequency response, and said probe further including a resistor serially connected between said probe tip and said first end of said signal conducting lead, said resistance providing a resistance value substantially less than said input impedance so as to substantially flatten said frequency response, whereby accurate amplitude measurements of signals over a wide range of frequencies are provided.

2. The probe of claim 1 wherein said resistor is a fixed resistor.

3. The probe of claim 1 wherein said resistor is a variable resistor.

4. An adjunct for use with a measurement probe having an input impedance, a signal conducting lead having a capacitance and a ground lead for connection to a circuit under test, said ground lead having an inductance, the respective capacitance and inductance of said signal conducting lead and said ground lead forming a resonant circuit having a non-flat frequency response, and said adjunct fitting over an end of said probe and having an electrically conductive member connected to said signal conducting lead, said probe adjunct further comprising a resistor serially connected to said electrically conductive member, said resistor providing a resistance value substantially less than said input impedance so as to substantially flatten said frequency response and thereby provide accurate amplitude measurements of signals over a wide range of frequencies.

5. The adjunct of claim 4 wherein said resistor is a fixed resistor.

6. The adjunct of claim 4 wherein said resistor is a variable resistor.

7. A method of providing an electrical signal to measurement apparatus, said method comprising the steps of introducing said electrical signal to a measurement probe connected to said measurement apparatus, said measurement probe having an input impedance, a probe tip connected to an end of a signal conducting lead having a capacitance, and a ground lead for connection to a circuit under test, said ground lead having an inductance, the capacitance of said signal conducting lead and the inductance of said ground lead forming a resonant circuit having a non-flat frequency response, and providing an electrical resistance in series between said probe tip and said end of said signal conducting lead, said resistance having a value which is substantially less than said input impedance and which substantially dampens said frequency response.

8. A probe for use with measurement equipment, said probe comprising a signal conducting lead, a ground lead for connection to a circuit under test and a signal attenuation circuit having an impedance connected to said signal conducting lead, said probe having a non-flat frequency response due to resonance between said ground lead and said attenuation circuit, and said probe further including a resistor serially connected between an end of said probe and said attenuation circuit, said resistor having a value which is substantially less than that of said attenuation network, said resistor substantially flattening said frequency response whereby accurate measurements of signals over a wide range of frequencies are provided.

9. The probe of claim 8 wherein said resistor is a fixed resistor.

10. The probe of claim 8 wherein said resistor is a variable resistor.

* * * * *